(12) United States Patent
Murtuza et al.

(10) Patent No.: US 6,849,944 B2
(45) Date of Patent: Feb. 1, 2005

(54) USING A SUPPORTING STRUCTURE TO CONTROL COLLAPSE OF A DIE TOWARDS A DIE PAD DURING A REFLOW PROCESS FOR COUPLING THE DIE TO THE DIE PAD

(75) Inventors: Masood Murtuza, Sugar Land, TX (US); Muthiah Venkateswaran, Richardson, TX (US); Satyendra S. Chauhan, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/449,353

(22) Filed: May 30, 2003

(65) Prior Publication Data

US 2004/0238956 A1 Dec. 2, 2004

(51) Int. Cl.[7] ............................................. H01L 23/48
(52) U.S. Cl. ..................... 257/734; 257/736; 257/737; 257/738; 438/612; 438/613; 438/614
(58) Field of Search ................................ 438/612–615; 257/734–739

(56) References Cited

U.S. PATENT DOCUMENTS

| | | | |
|---|---|---|---|
| 5,291,062 A | 3/1994 | Higgins, III | 257/698 |
| 5,872,400 A * | 2/1999 | Chapman et al. | 257/738 |
| 5,991,156 A | 11/1999 | Bond et al. | 361/707 |
| 6,184,062 B1 * | 2/2001 | Brofman et al. | 438/106 |
| 6,350,669 B1 * | 2/2002 | Pu et al. | 438/613 |
| 6,507,121 B2 * | 1/2003 | Huang | 257/780 |

* cited by examiner

*Primary Examiner*—Hsien-Ming Lee
(74) *Attorney, Agent, or Firm*—W. Daniel Swayze, Jr.; W. James Brady; Frederick J. Telecky, Jr.

(57) ABSTRACT

In one embodiment, an integrated circuit package includes a die associated with an integrated circuit and a die pad. The die has a bottom surface, and the pad has a top surface opposite the bottom surface of the die. Two or more bump pad traces are each coupled to the top surface of the pad, and one or more other traces are each coupled to the top surface of the pad in a corresponding inter-bump pad region between adjacent bump pad traces. A number of solder bumps each couple the die to the pad at a corresponding bump pad trace to provide electrical connectivity between circuitry associated with the die and circuitry associated with the die pad. Each inter-bump pad region is free from any solder mask material deposited to control collapse of the die towards the pad during a reflow process for bonding the die to the pad using the bumps, a supporting structure that contacts the die during the reflow process having been used instead.

37 Claims, 2 Drawing Sheets

US 6,849,944 B2

USING A SUPPORTING STRUCTURE TO CONTROL COLLAPSE OF A DIE TOWARDS A DIE PAD DURING A REFLOW PROCESS FOR COUPLING THE DIE TO THE DIE PAD

TECHNICAL FIELD OF THE INVENTION

This invention relates generally to integrated circuit structures and more particularly to using a supporting structure to control collapse of a die towards a die pad during a reflow process for coupling the die to the die pad.

BACKGROUND

Integrated circuit packages and other structures such as ball grid arrays (BGAs) may include a first layer bonded to a second layer using one or more solder bumps or solder balls. For example, an integrated circuit package such as a flip chip assembly may include a plurality of solder bumps coupling a die to a die pad at corresponding bump pad traces on the top surface of the die pad. During a reflow process used to bond the die to the die pad using the solder bumps, the integrated circuit structure may collapse such that the die may collapse towards the die pad. One solution to reduce or prevent collapse of the die towards the die pad during the reflow process may include coupling solder mask material to other traces in each inter-bump pad region to control spread of the solder bumps; however, this solution may increase the cost of constructing the integrated circuit package, particularly where precision deposition of the solder mask material is necessary.

SUMMARY OF THE INVENTION

According to the present invention, certain disadvantages and problems associated with previous techniques for controlling collapse of a die towards a die pad during a reflow process for coupling the die to the die pad may be reduced or eliminated.

In one embodiment, an integrated circuit package includes a die associated with an integrated circuit, the die having a bottom surface. The integrated circuit package also includes a die pad having a top surface opposite the bottom surface of the die. Two or more bump pad traces are each coupled to the top surface of the die pad, and one or more other traces are each coupled to the top surface of the die pad in a corresponding inter-bump pad region between adjacent bump pad traces. A number of solder bumps each couple the die to the die pad at a corresponding bump pad trace to provide electrical connectivity between circuitry associated with the die and circuitry associated with the die pad. Each inter-bump pad region is free from any solder mask material deposited to control collapse of the die towards the die pad during a reflow process for bonding the die to the die pad using the solder bumps, a supporting structure that contacts the die during the reflow process having been used instead to substantially prevent collapse of the die towards the die pad.

Particular embodiments of the present invention may provide one or more technical advantages. In certain embodiments, using the supporting structure during the reflow process may reduce or eliminate the need to deposit solder mask material in the inter-bump pad regions to control the collapse of the die towards the die pad during the reflow process. This may reduce manufacturing costs associated with certain integrated circuit packages because deposition of the solder mask material in the inter-bump pad regions to control collapse may increase costs, particularly where precision deposition of the solder mask material is necessary. In certain embodiments, elimination of solder mask material from the inter-bump pad regions may increase stand-off that helps improve the yield of the integrated circuit package, possibly resulting in improved underfill flow. In certain embodiments, the present invention may be applied to ball grid array (BGA) packages.

Certain embodiments of the present invention may provide some, all, or none of the above technical advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

Figure 1:
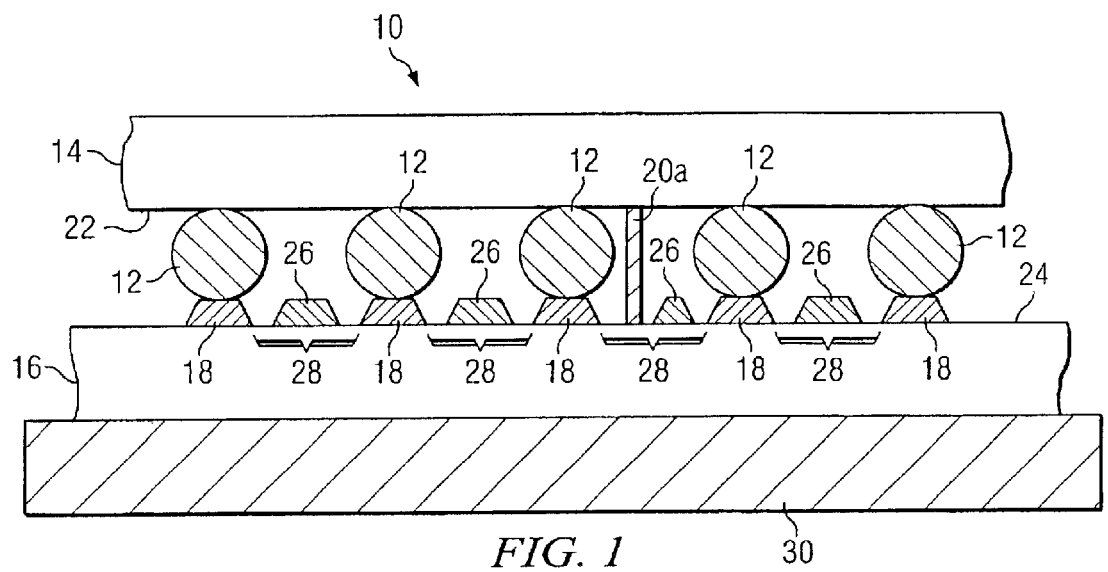
FIG. 1 illustrates a cross-sectional view of an example integrated circuit package in which solder bumps couple a die to a die pad at corresponding bump pad traces, one or more posts having been used to substantially prevent collapse of the die towards the die pad during the reflow process.

FIG. 1 illustrates a cross-sectional view of an example integrated circuit package 10 in which solder bumps 12 couple a die 14 to a die pad 16 at corresponding bump pad traces 18, one or more posts 20a that contact die 14 during the reflow process for bonding die 14 to die pad 16 having been used to substantially prevent collapse of die 14 towards die pad 16 during the reflow process. In one embodiment, integrated circuit package 10 includes a flip chip assembly, although the present invention contemplates integrated circuit package 10 including any suitable type of integrated circuit package in which one or more solder bumps or solder balls couple layers of the integrated circuit package. Reference to solder bumps is meant to include solder bumps, solder balls, or any other suitable structures.

Die 14 may be associated with an integrated circuit and has a bottom surface 22. Die 14 may have any suitable area and shape, according to particular needs. Die pad 16 has a top surface 24 opposite bottom surface 22 of die 14. Die pad 16 includes circuitry surrounded by, for example, a dielectric or other suitable material. In one embodiment, die pad 16 may include a standard laminate. In certain embodiments, die pad 16 may form a substrate of integrated circuit package 10 for coupling to one or more printed circuit boards, in a BGA assembly for example. Die pad 16 may have any suitable area and shape, according to particular needs.

Integrated circuit package 10 may include two or more bump pad traces 18 each coupled to top surface 24 of die pad 16. Although a particular number of bump pad traces 18 are shown, each having a particular shape, integrated circuit package 10 may include any suitable number of bump pad traces 18, each having any suitable shape. Bump pad traces 18 may have any suitable pitch (i.e. center-to-center separation between bump pad traces 18). Bump pad traces 18 may include copper, aluminum, tungsten, or any other suitable metal or metal alloy.

Integrated circuit package 10 may include one or more other traces 26, not associated with solder bumps 12, each coupled to top surface 24 of die pad 16 in a corresponding inter-bump pad region 28 between adjacent bump pad traces 18. Although a particular number of traces 26 are shown, each having a particular shape, integrated circuit package 10 may include any suitable number of traces 26, each having any suitable shape. Traces 26 may include copper, aluminum, tungsten, or any other suitable metal or metal alloy. In certain embodiments, integrated circuit package 10 may include solder mask material that has been deposited on one or more traces 26 for purposes other than controlling collapse of die 14 towards die pad 16.

Solder bumps 12 each couple die 14 to die pad 16 at a corresponding bump pad trace 18 to provide electrical connectivity between circuitry associated with die 14 and circuitry associated with die pad 16. Solder bumps 12 may include lead, copper, aluminum, tungsten, or any other suitable metal or metal alloy. Solder bumps 12 may have any suitable shape and material density. Although solder bumps 12 are illustrated as being the same size, solder bumps 12 may vary in size if appropriate. Additionally, although a specific number of solder bumps 12 are illustrated, integrated circuit structure 10 may include any suitable number of solder bumps 12 according to particular needs. Solder bumps 12 may have any suitable pitch (i.e. center-to-center separation between solder bumps 12). In one embodiment, integrated circuit package 10 may include an under bump metal (not shown) between solder bumps 12 and their corresponding bump pad trace 18. The under bump metal may include sputtered aluminum-nickel-copper, evaporated chrome-copper, nickel, or any other suitable material according to particular needs.

Although integrated circuit structure 10 is shown as including one row including solder bumps 12, bump pad traces 18, and other traces 26, integrated structure 10 may include solder bumps 12, traces 18, and traces 26 in any suitable arrangement.

In one embodiment, each inter-bump pad region 28 is free from any solder mask material deposited to control collapse of die 14 towards die pad 16 during the reflow process for bonding die 14 to die pad 16 using solder bumps 12, a supporting structure 20 that contacts die 14 during the reflow process having been used instead to substantially prevent collapse of die 14 towards die pad 16. The reflow process may include a thermal process for bonding die 14 to die pad 16 using solder bumps 12. For example, solder bumps 12 may be bonded to corresponding bump pad traces 18 by applying heat such that solder bumps 12 melt sufficiently to bond to corresponding bump pad traces 18 when heat application is terminated. In certain embodiments, solder bumps 12 may be similarly bonded to die 14. In certain embodiments, integrated circuit package 10 may include solder mask material that has been deposited in inter-bump pad regions 28 for purposes other than controlling collapse of die 14 towards die pad 16, such as on one or more of other traces 26 for example.

In one embodiment, supporting structure 20 includes one or more posts 20a coupled to a tray 30 (as illustrated in FIG. 1, for example), tray 30 underlying and supporting die pad 16 during the reflow process, each post 20a extending through top surface 24 of die pad 16 in one of the inter-bump pad regions 28 and contacting bottom surface 22 of die 14 during the reflow process to substantially prevent collapse of die 14 towards die pad 16 during the reflow process. Tray 30 may include any suitable material and may have any suitable shape, according to particular needs. Posts 20a may have any suitable shape. In one embodiment, each post 20a includes steel, although the present invention contemplates posts 20a including any suitable material according to particular needs.

Although only one post 20a is illustrated, integrated circuit package 10 may include any suitable number of posts 20a according to particular needs. In one embodiment, integrated circuit package 10 includes a minimum of three posts 20a during the reflow process. In another embodiment, integrated circuit package 10 includes a post 20a near each corner region of die 14 during the reflow process. For example, in an embodiment in which die 14 is substantially rectangular in shape, integrated circuit package 10 may include a minimum of four posts 20a during the reflow process, at least one post 20a being near each of the four corner regions of the rectangular die 14 during the reflow process. In one embodiment, tray 30 and the one or more posts 20a coupled to tray 30 are removed from integrated circuit structure 10 after the reflow process.

In addition to certain features described above with reference to FIG. 1, FIG. 2 illustrates a cross-sectional view of an example integrated circuit package 10 in which one or more solder bumps 12 couple a die 14 to a die pad 16 at corresponding bump pad traces 18, one or more solder mask regions 20b that contact die 14 during a reflow process for bonding die 14 to die pad 16 having been used to substantially prevent collapse of die 14 towards die pad 16 during the reflow process. In the embodiment illustrated in FIG. 2, supporting structure 20 includes one or more solder mask regions 20b each coupled to top surface 24 of die pad 16 and contacting bottom surface 22 of die 14 at a corresponding perimeter region 32 of die 14 to substantially prevent collapse of die 14 towards die pad 16 during the reflow process. Solder mask regions 20b may include photosensitive benzocyclobutene (BCB) or any other suitable material according to particular needs.

In one embodiment, integrated circuit package 10 includes the one or more solder mask regions 20b after the reflow process. Each solder mask region 20b may have any suitable area according to particular needs. Perimeter regions 32 may have any suitable size according to particular needs. In one embodiment, perimeter regions 32 may include corner regions of die 14. For example, in an embodiment in which die 14 is substantially rectangular in shape, integrated circuit package 10 may include a minimum of four perimeter regions 32 that include the four corner regions of die 14. Although two solder mask regions 20b are illustrated, integrated circuit package 10 may include any suitable number of solder mask regions 20b such that die 14 is substantially prevented from collapsing towards die pad 16 during the reflow process.

Particular embodiments of the present invention may provide one or more technical advantages. In certain embodiments, using supporting structure 20 during the reflow process may reduce or eliminate the need to deposit solder mask material in inter-bump pad regions 28 to control the collapse of die 14 towards die pad 16 during the reflow process. This may reduce manufacturing costs associated with certain integrated circuit packages 10 because deposition of the solder mask material in inter-bump pad regions 28 to control collapse may increase costs, particularly where precision deposition of the solder mask material is necessary. In certain embodiments, elimination of solder mask material from inter-bump pad regions 28 may increase stand-off that helps improve the yield of integrated circuit package 10, possibly resulting in improved underfill flow. In certain embodiments, the present invention may be applied to ball grid array (BGA) packages.

Figure 3:
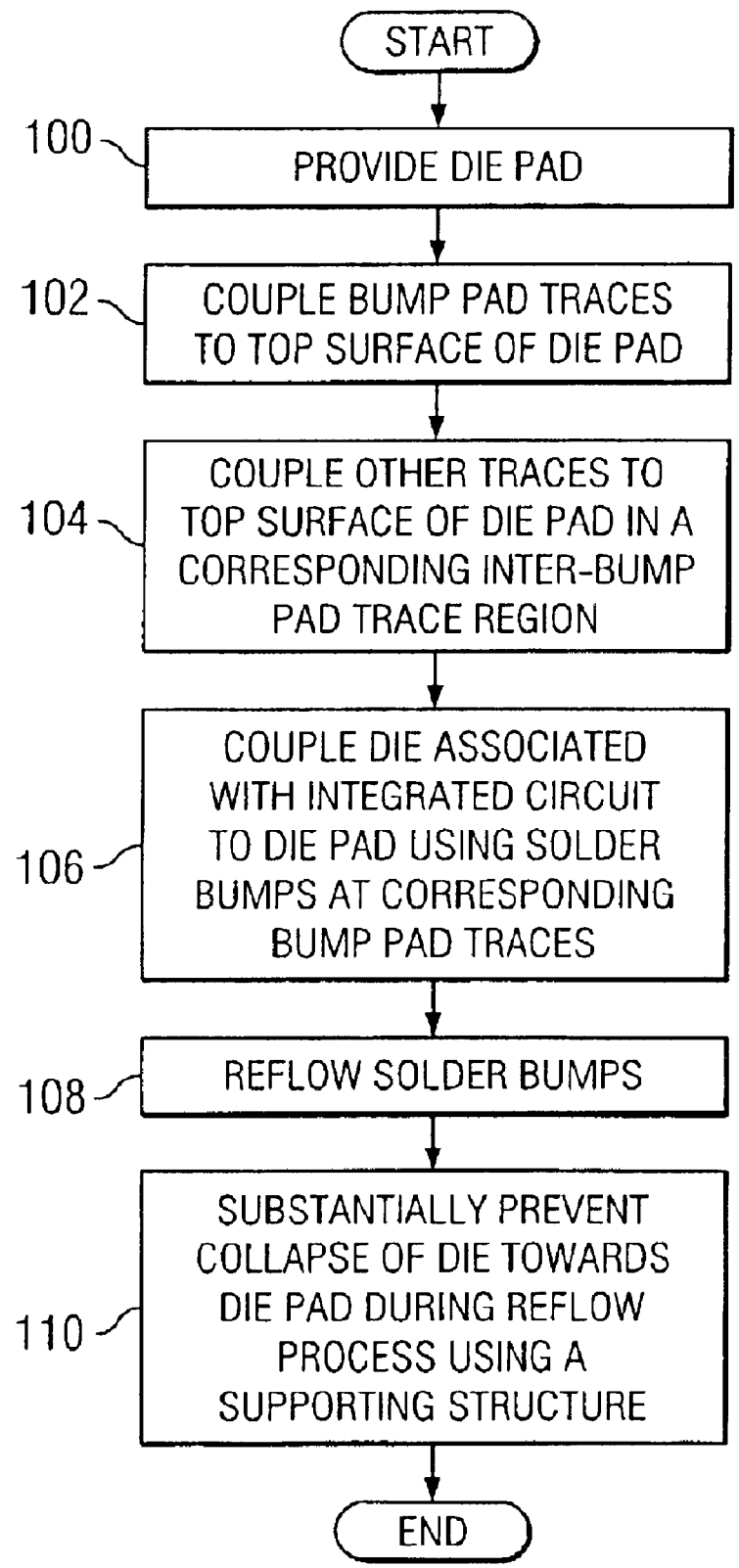
FIG. 3 illustrates an example method for providing an integrated circuit package in which in which solder bumps couple a die to a die pad at corresponding bump pad traces, one or more supporting structures having been used to substantially prevent collapse of the die towards the die pad during the reflow process.

FIG. 3 illustrates an example method for providing an integrated circuit package 10 in which in which a plurality of solder bumps 12 couple die 14 to a die pad 16 at corresponding bump pad traces 18, one or more supporting structures 20 that contact die 14 during the reflow process for bonding die 14 to die pad 16 having been used to substantially prevent collapse of die 14 towards die pad 16. At step 100, die pad 16 is provided. At step 102, two or more bump pad traces 18 are each coupled to top surface 24 of die pad 16. As described above, integrated circuit package 10 may include any suitable number of bump pad traces 18. At step 104, one or more other traces are each coupled to top surface 24 of die pad 16 in a corresponding inter-bump pad region between adjacent bump pad traces 18. As described above. Integrated circuit package 10 may include any suitable number of other traces 26.

At step 106, a die 14 associated with an integrated circuit is coupled to die pad 16 using solder bumps 12 corresponding bump pad traces 18 to provide electrical conductivity between circuitry associated with die 14 and circuitry associated with die pad 16. As described above, integrated circuit structure 10 may include any suitable number of solder bumps 12 according to particular needs. At step 108, solder bumps 12 are reflowed to bond solder bumps 12 to die 14 and to the corresponding bump pad traces 18. Reflow process may include a thermal process for bonding die 14 to die pad 16 using solder bumps 12. For example, solder bumps 12 may be bonded to corresponding bump pad traces 18 by applying heat such that solder bumps 12 melt sufficiently to bond to corresponding bump pad traces 18 when heat application is terminated. In certain embodiments, solder bumps 12 may be similarly bonded to die 14. At step 110, collapse of die 14 towards die pad 16 during the reflow process is substantially prevented using a supporting structure 20 that contacts die 14 during the reflow process instead of depositing any solder mask material in one or more of inter-bump pad regions 28 to control the collapse of die 14 towards die pad 16 during the reflow process.

In the embodiment illustrated in FIG. 1, step 110 may include substantially preventing collapse of die 14 towards die pad 16 during the reflow process using one or more posts 20a coupled to a tray 30, tray 30 underlying and supporting die pad 16 during the reflow process and each post 20a extending through top surface 24 of die pad 16 in one of the inter-bump pad regions 28 and contacting bottom surface 22 of die 14 during the reflow process to substantially prevent collapse of die 14 towards die pad 16 during the reflow process. Although only one post 20a is illustrated, integrated circuit package 10 may include any suitable number of posts 20a according to particular needs. In one embodiment, integrated circuit package 10 includes a minimum of three posts 20a during the reflow process. In one embodiment, integrated circuit package 10 includes a post 20a near each corner region of die 14 during the reflow process. For example, in an embodiment in which die 14 is substantially rectangular in shape, integrated circuit package 10 may include a minimum of four posts 20a during the reflow process, at least one post 20a being near each of the four corner regions of the rectangular die 14 during the reflow process. In one embodiment, tray 30 and the one or more posts 20a coupled to tray 30 are removed from integrated circuit structure 10 after the reflow process.

Figure 2:
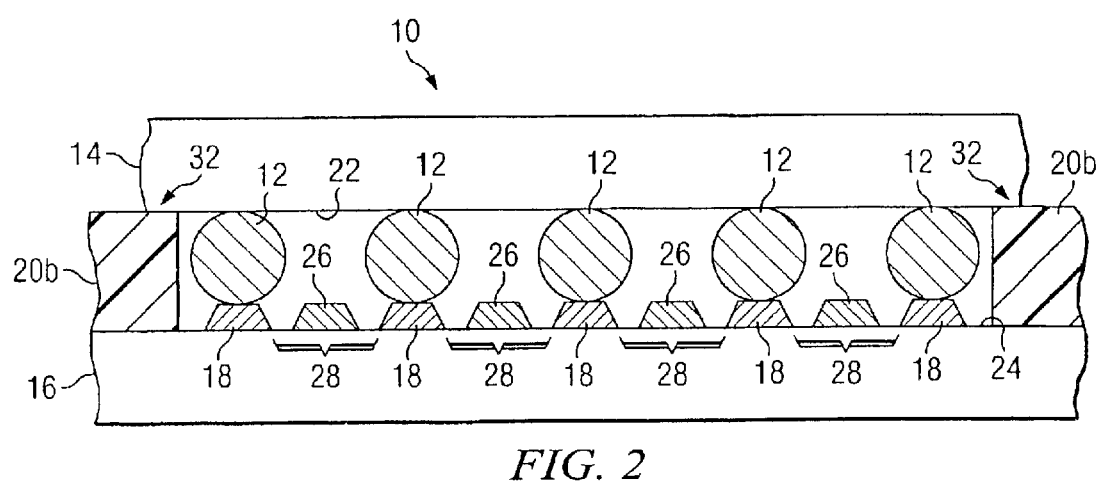
FIG. 2 illustrates a cross-sectional view of an example integrated circuit package in which solder bumps couple a die to a die pad at corresponding bump pad traces, one or more solder mask regions having been used to substantially prevent collapse of the die towards the die pad during the reflow process.

In the embodiment illustrated in FIG. 2, step 110 may include substantially preventing collapse of die 14 towards die pad 16 during the reflow process using one or more solder mask regions 20b each coupled to top surface 24 of die pad 16 and contacting bottom surface 22 of die 14 at a corresponding perimeter region 32 of die 14 to substantially prevent collapse die 14 towards die pad 16 during the reflow process. In one embodiment, integrated circuit package 10 includes the one or more solder mask regions 20b after the reflow process. In one embodiment, perimeter regions 32 may include corner regions of die 14. For example, in an embodiment in which die 14 is substantially rectangular in shape, integrated circuit package 10 may include a minimum of four perimeter regions 32 that include the four corner regions of die 14. Although two solder mask regions 20b are illustrated, integrated circuit package 10 may include any suitable number of solder mask regions 20b such that die 14 is substantially prevented from collapsing towards die pad 16 during the reflow process.

In practice, the steps of the method may be performed in any suitable order and may overlap in whole or in part according to integrated circuit packaging considerations. As just one example, bump pad traces 18 and other traces 26 may be coupled to top surface 24 of die pad 16 (steps 102 and 104 of the method) at substantially the same time.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. An integrated circuit package, comprising:
  a die associated with an integrated circuit, the die having a bottom surface;
  a die pad having a top surface opposite the bottom surface of the die;
  at least two bump pad traces each coupled to the top surface of the die pad;
  a plurality of traces each coupled to the top surface of the die pad in a corresponding inter-bump pad region between adjacent bump pad traces; and
  a plurality of solder bumps each coupling the die to the die pad at a corresponding bump pad trace to provide electrical connectivity between circuitry associated with the die and circuitry associated with the die pad;
  each inter-bump pad region being free from any solder mask material deposited to control collapse of the die towards the die pad during a reflow process for bonding the die to the die pad using the solder bumps, a supporting structure that contacts the die during the reflow process having been used instead to substantially prevent collapse of the die towards the die pad.

2. The package of claim 1, wherein the supporting structure comprises a plurality of posts coupled to a tray, the tray underlying and supporting the die pad during the reflow process, each post extending through the top surface of the die pad in one of the inter-bump pad region and contacting the bottom surface of the die during the reflow process to substantially prevent collapse of the die towards the die pad during the reflow process.

3. The package of claim 2, wherein the tray and the plurality of posts coupled to the tray have been removed after the reflow process.

4. The package of claim 2, wherein each of the plurality of posts comprises steel.

5. The package of claim 2, comprising a minimum of three posts.

6. The package of claim 2, comprising a post near each corner region of the die.

7. The package of claim 1, wherein the supporting structure comprise a plurality of solder mask regions each coupled to the top surface of the die pad and contacting the bottom surface of the die at a corresponding perimeter region of the die to substantially prevent collapse of the die towards the die pad during the reflow process.

8. The package of claim 7, wherein the plurality of solder mask regions remain after the reflow process.

9. The package of claim 7, wherein the perimeter regions comprise at least four corner regions of the die.

10. The package of claim 1, wherein solder mask material has been deposited in the inter-bump pad region.

11. The package of claim 1, wherein the reflow process comprises a thermal process for bonding the die to the die pad using the solder bumps.

12. The package of claim 1, wherein the package comprises a flip chip assembly.

13. A method for forming an integrated circuit package, comprising:
    providing a die pad to be used in said integrated circuit package having a top surface;
    coupling at least two bump pad traces to the lop surface of the die pad;
    coupling each of a plurality of traces to the top surface of the die pad in a corresponding inter-bump pad region between adjacent bump pad traces;
    coupling a die associated with an integrated circuit to the die pad using a plurality of solder bumps, each coupling the die to the die pad at a corresponding bump pad trace, to provide electrical connectivity between circuitry associated with the die and circuitry associated with the die pad;
    reflowing the solder bumps to bond the solder bumps to the die and to the corresponding bump pad traces; and
    substantially preventing collapse of the die towards the die pad during the reflow process using a supporting structure that contacts the die during the reflow process, the supporting structure being used instead of depositing any solder mask material in at least one inter-bump pad region to control the collapse of the die towards the die pad during the reflow process.

14. The method of claim 13, wherein the supporting structure comprises at least one post coupled to a tray, the tray underlying and supporting the die pad during the reflow process, each post extending through the top surface of the die pad in one of the inter-bump pad regions and contacting the bottom surface of the die during the reflow process to substantially prevent collapse of the die towards the die pad during the reflow process.

15. The method of claim 14, further comprising removing the tray and the at least one post coupled to the tray after reflowing.

16. The method of claim 14, wherein each of the at least one post comprises steel.

17. The method of claim 14, wherein the supporting structure comprises a minimum of three posts.

18. The method of claim 14, wherein the supporting structure comprises a post near each corner region of the die.

19. The method of claim 13, wherein the supporting structure comprises a plurality of solder mask regions each coupled to the top surface of the die pad and contacting the bottom surface of the die at a corresponding perimeter region of the die to substantially prevent collapse of the die towards the die pad.

20. The method of claim 19, further comprising leaving the a plurality of solder mask regions in place after reflowing.

21. The method of claim 19, wherein the perimeter regions comprise at least four corner regions of the die.

22. The method of claim 13, further comprising depositing solder mask material on another trace.

23. The method of claim 13, wherein reflowing comprises applying a thermal process for bonding the die to the die pad using the solder bumps.

24. The method of claim 13, wherein the package comprises a flip chip assembly.

25. A method for controlling collapse of a die towards a die pad during a reflow process for coupling the die to the die pad, comprising:
    providing the die pad having a top surface;
    coupling at least two bump pad traces to the top surface of the die pad;
    coupling each of a plurality of traces to the top surface of the die pad in a corresponding inter-bump pad region between adjacent bump pad traces;
    coupling the die associated with an integrated circuit to the die pad using a plurality of solder bumps, each coupling the die to the die pad at a corresponding bump pad trace, to provide electrical connectivity between circuitry associated with the die and circuitry associated with the die pad;
    reflowing the solder bumps to bond the solder bumps to the die and to the corresponding bump pad traces; and
    substantially preventing collapse of the die towards the die pad during the reflow process using a supporting structure that contacts the die during the reflow process, the supporting structure being used instead of depositing any solder mask material in the inter-bump pad region to control the collapse of the die towards the die pad during the reflow process.

26. The method of claim 25, wherein the supporting structure comprises plurality of posts coupled to a tray, the tray underlying and supporting the die pad during the reflow process, each post extending through the top surface of the die pad in one of the inter-bump pad region and contacting the bottom surface of the die during the reflow process to substantially prevent collapse of the die towards the die pad during the reflow process.

27. The method of claim 26, further comprising removing the tray and the plurality of posts coupled to the tray after reflowing.

28. The method of claim 26, wherein each of the plurality of posts comprises steel.

29. The method of claim 26, wherein the supporting structure comprises a minimum of three posts.

30. The method of claim 26, wherein the supporting structure comprises a post near each corner region of the die.

31. The method of claim 25, wherein the supporting structure comprises a plurality of solder mask regions each coupled to the top surface of the die pad and contacting the bottom surface of the die at a corresponding perimeter region of the die to substantially prevent collapse of the die towards the die pad.

32. The method of claim 31, further comprising leaving the plurality of solder mask regions in place after reflowing.

33. The method of claim 31, wherein the perimeter regions comprise at least four corner regions of the die.

34. The method of claim 25, further comprising depositing solder mask material on another trace.

35. The method of claim 25, wherein reflowing comprises applying a thermal process for bonding the die to the die pad using the solder bumps.

36. The method of claim 25, wherein the package comprises a flip chip assembly.

37. A flip chip assembly, comprising:
- a die associated with an integrated circuit, the die having a bottom surface;
- a die pad having a top surface opposite the bottom surface of the die;
- at least two bump pad traces each coupled to the top surface of the die pad;
- a plurality of traces each coupled to the top surface of the die pad in a corresponding inter-bump pad region between adjacent bump pad traces; and
- a plurality of solder bumps each coupling the die to the die pad at a corresponding bump pad trace to provide electrical connectivity between circuitry associated with the die and circuitry associated with the die pad;
- each inter-bump pad region being free from any solder mask material deposited to control collapse of the die towards the die pad during a reflow process, the reflow process comprising a thermal process for bonding the die to the die pad using the solder bumps, a plurality of posts near each corner region of the die that contact the die during the reflow process having been used instead to substantially prevent collapse of the die towards the die pad the plurality of posts coupled to a tray, the tray underlying and supporting the die pad during the reflow process, each post extending through the top surface of the die pad in the inter-bump pad region and contacting the bottom surface of the die during the reflow process.

* * * * *